(12) United States Patent
Powell

(10) Patent No.: US 8,746,236 B2
(45) Date of Patent: Jun. 10, 2014

(54) SOLAR ENERGY COLLECTOR SYSTEM

(76) Inventor: Trevor Powell, Highvale (AU)

( * ) Notice: Subject to any disclaimer, the term of this patent is extended or adjusted under 35 U.S.C. 154(b) by 0 days.

(21) Appl. No.: 13/642,104

(22) PCT Filed: Apr. 21, 2011

(86) PCT No.: PCT/AU2011/000460
§ 371 (c)(1),
(2), (4) Date: Oct. 18, 2012

(87) PCT Pub. No.: WO2011/130794
PCT Pub. Date: Oct. 27, 2011

(65) Prior Publication Data
US 2013/0037072 A1    Feb. 14, 2013

(30) Foreign Application Priority Data

Apr. 22, 2010 (AU) .............................. 2010901704

(51) Int. Cl.
*F24J 2/10* (2006.01)

(52) U.S. Cl.
USPC ........... 126/694; 126/696; 126/600; 126/651; 126/684; 126/692; 136/206; 136/259

(58) Field of Classification Search
USPC ......... 126/600, 603, 605, 606, 607, 651, 684, 126/692; 136/206, 259
See application file for complete search history.

(56) References Cited

U.S. PATENT DOCUMENTS 4,249,514 A * 2/1981 Jones ............................ 126/605

* cited by examiner

*Primary Examiner* — Alfred Basichas
(74) *Attorney, Agent, or Firm* — Birch, Stewart, Kolasch & Birch, LLP

(57) ABSTRACT

A solar energy collector system (32) has a fixed array (34) of reflectors (40) extending in parallel rows, and a common focal receiver (36) located above the fixed array (34) and extending parallel to the rows of reflectors (40). Incident solar radiation from all of the reflectors is reflected upon the receiver (36) which includes a heat absorbing medium adapted to absorb heat from the reflected radiation. There is an elevated support structure (38) for the fixed array (34) of reflectors and the receiver (36). The support structure (38) orients each row of reflectors at a respective fixed angle relative to the support structure. The support structure (38) is pivotally mounted to an upright elevation assembly (77) to allow controlled rotation of the fixed array (34) and receiver (36) simultaneously about a pivotal axis (39) extending parallel to the rows of reflectors (40) so as to track the movement of the sun.

11 Claims, 12 Drawing Sheets

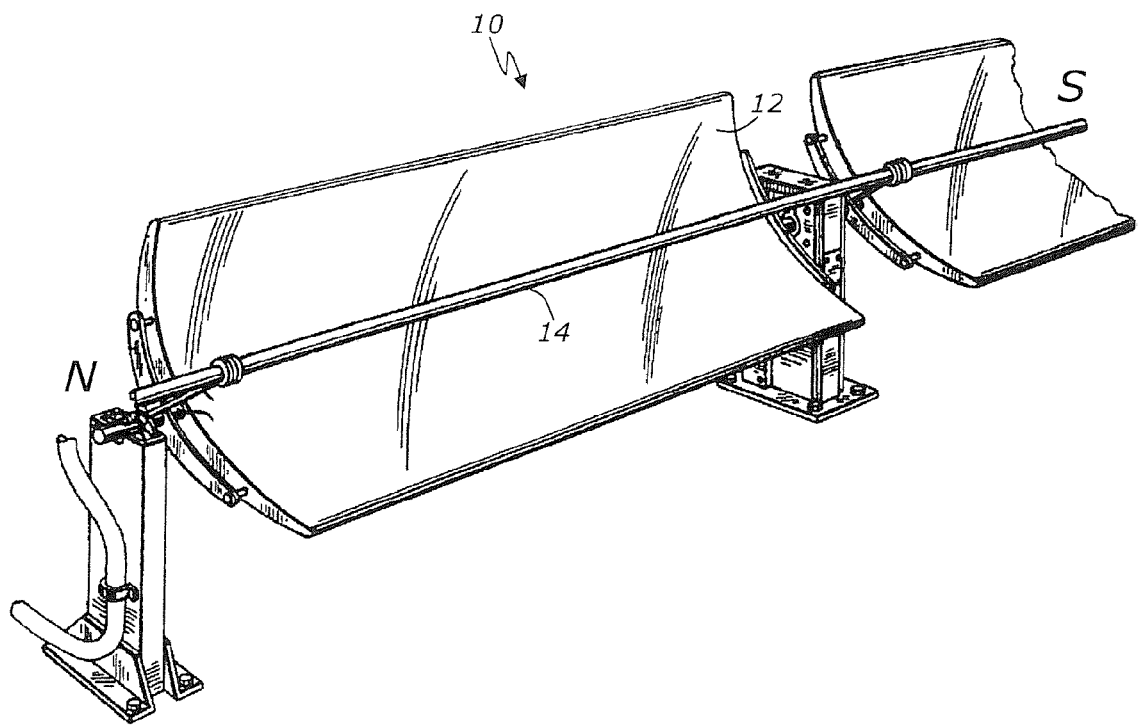
Fig.1 - Prior Art

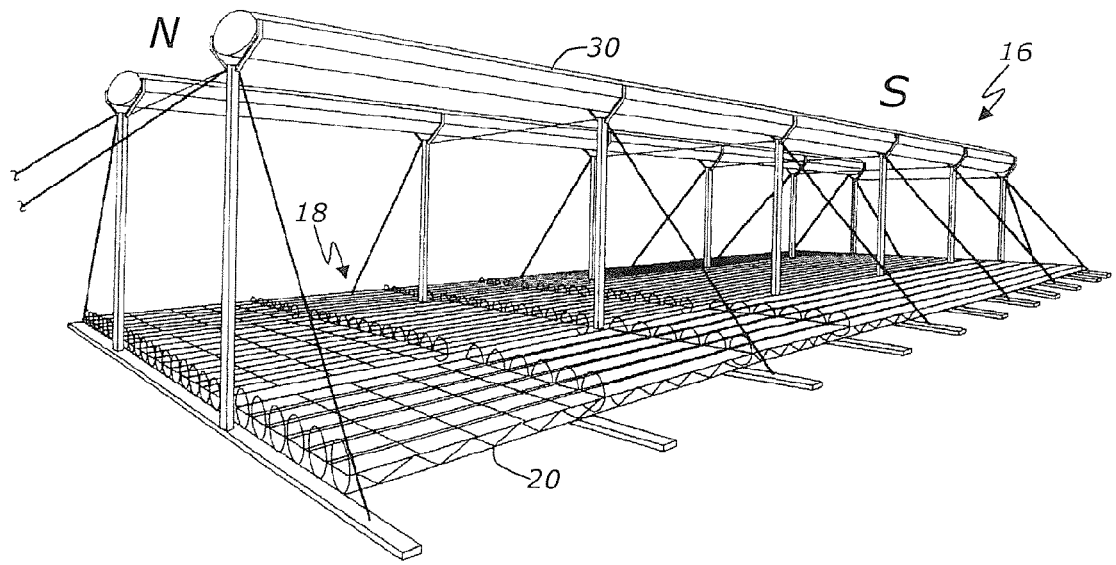
Fig.2 - Prior Art
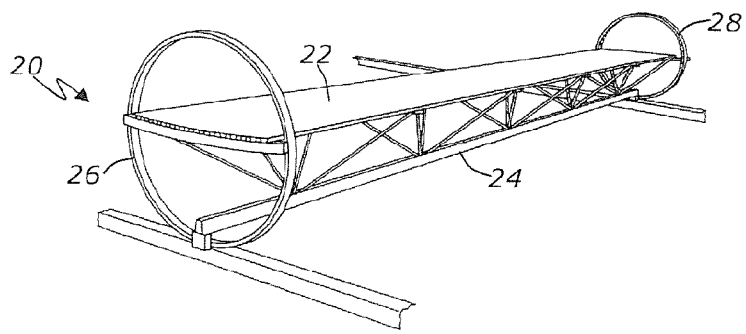
Fig.3 - Prior Art
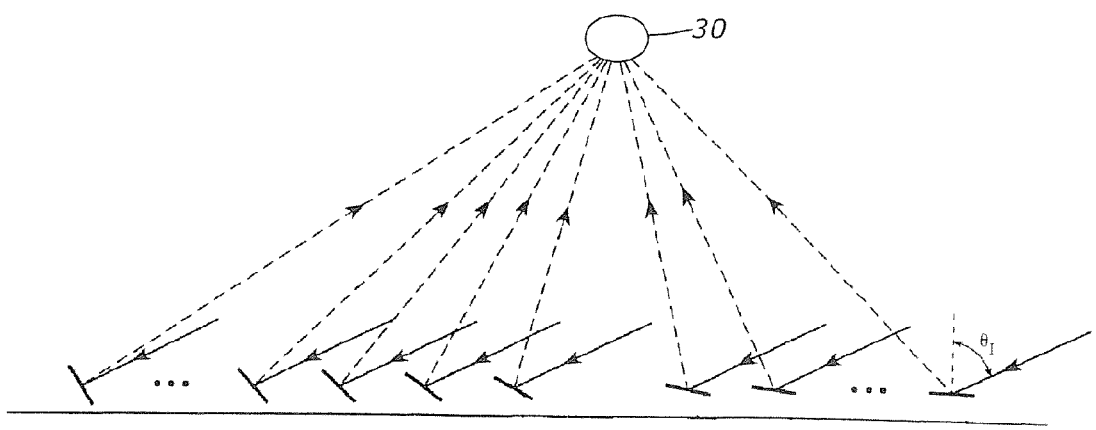
Fig.4 - Prior Art

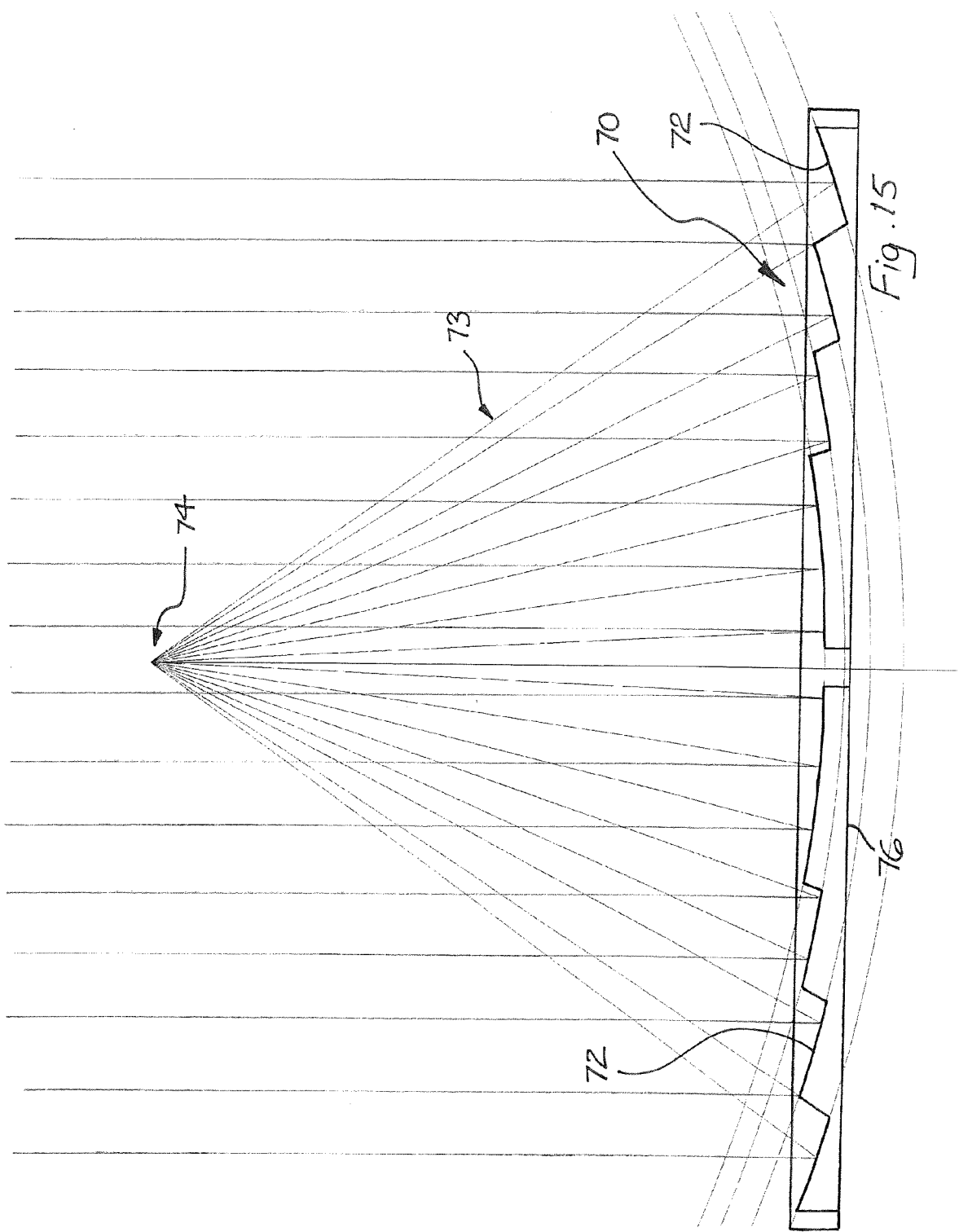

SOLAR ENERGY COLLECTOR SYSTEM

This application is the National Stage under 35 USC §371 of International Application PCT/AU2011/000460 filed Apr. 21, 2011, which claims priority under 35 USC §119(a-d) of Application Number 2010901704 filed in Australia on Apr. 22, 2010.

FIELD OF THE INVENTION

The present invention relates to a solar energy collector system and, more particularly, to systems and methods for concentrating solar energy to generate heat and steam, such as may be used for electricity generation.

BACKGROUND OF THE INVENTION

Various types of solar energy collectors are known, and include non-concentrating types and concentrating types. Non-concentrating types intercept parallel unconcentrated rays of the sun with an array of detection or receiving devices such as a solar panel of photovoltaic cells or hot water pipes, for example. Photovoltaic cells use photovoltaic material to absorb sunlight and convert it directly to electricity. A concentrating type collector focuses energy rays using a special mirror surface assembly to concentrate the rays and create an intense beam of energy. Such assemblies generally comprise a parabolic reflector or lens assembly to reflect sunlight onto a focal receiver, usually in the form of a pipe carrying a thermal fluid capable of absorbing heat (such as highly refined paraffinic petroleum oil or molten salt), which is pumped to a heat exchanger that boils water. The boiling of water produces steam that drives turbines which generate electricity.

Two common forms of concentrating type solar collectors are parabolic trough collectors and linear Fresnel collectors. A known parabolic trough collector 10 is shown in FIG. 1. Sunlight is reflected from a curved mirror surface 12, generally of a parabolic shape, to a receiver 14 (containing a heat absorbing medium) positioned at the focus (or focal axis) of the mirror surface 12. The mirror surface 12 and supporting structure is aligned on a north-south or east-west axis and rotates to track the daily motion of the sun. Commercial parabolic trough collector sites have mirror apertures of about 5 to 6 meters in width and are typically many hundreds of meters in length.

However, a problem with existing parabolic trough collectors utilising curved mirror glass is that the curved mirror is difficult and expensive to manufacture. Another problem with parabolic trough collectors is that the structure is heavy and cumbersome, requires strict design and manufacturing tolerances, typically requires complex rotating joints for the pipe carrying the thermal fluid, and is energy intensive to operate.

A known linear Fresnel collector 16 is shown in FIG. 2, in which sunlight is collected by an array 18 of individual reflectors, all of which are identical to a reflector 20, which is shown in more detail in FIG. 3. The array 18 is aligned in a north-south or east-west axis. Reflector 20 comprises a slightly concavely curved mirror 22 which is mounted on a frame 24 pivotable on rollers 26 and 28 connected to a drive system. Alternative designs of linear Fresnel collector are also known, but all such designs share the essential attribute that, as shown in FIG. 4, each reflector must rotate individually and independently over the course of a day to reflect the sunlight to a focal receiver 30 containing a heat absorbing medium.

A problem with known linear Fresnel collectors is that they need individual drive and control and positioning systems for each reflector, and complex supporting structure, which adds considerably to the overall complexity, vulnerability to failure, and cost of the collector. Another problem with known linear Fresnel collectors is that adjacent reflectors shade each other at low sun angles, such as at dawn or sunset, which decreases the overall efficiency of the collector.

The overall efficiency of linear Fresnel collectors is further decreased because of the relatively longer focal length required when compared to a parabolic trough collector of equivalent aperture width, and subsequent reflection losses at the remote edges of the mirror surface, particularly when the sun is at low angles. Sunlight striking the mirror surface at an acute angle reduces the amount of sunlight reflected upon the focal receiver, which approaches zero as the sun approaches the horizon.

The closest known prior art revealed in searches conducted to date are hereinafter described.

Japanese Patent Application No. 55112956A discloses a system utilising refracting focal lenses and no reflection in involved. The axis of rotation of that system is an axis around the centre line of the main tube, rather than an axis that is located below the main tube (or receiver). Also, the tube (or receiver) is not elevated from the surfaces where focusing of light occurs in that system.

US Patent Application No. 2009/0314325 discloses a system having many focal points for its many parabolic reflector strips in each reflector module, rather than having a common elevated receiver to which incident solar radiation from the rows of reflectors is reflected. Also, each truss in that system supports a plurality of reflector modules, and each such truss rotates relative to the support frame. There is no fixed angle of the reflector modules relative to the support frame in that system, and the rotation axis of the support frame is perpendicular to the longitudinal axis of each truss. This allows the reflector modules to move relative to the support structure.

US Patent Application No. 2009/0174957 discloses a system that utilises a plurality of planar reflecting mirrors which can be adjusted to different respective angles on the basis of the alignment of each mirror with an electric field, and no elevated and pivotable support structure for a fixed array of reflectors and a receiver is disclosed.

US Patent Application No. 2009/0272425 discloses a system utilizing a parabolic main reflector, with the Fresnel lens only being used for refraction, not reflection.

It is an object of the present invention to provide a solar energy collector system that overcomes, or substantially ameliorates, the aforementioned shortcomings of the prior art, or at least provides a useful alternative.

It is another object of the present invention to provide a solar energy collector system which is relatively light, does not require a complicated drive system, and is simple, versatile, cheap and easy to manufacture and erect compared to prior art solar collectors.

SUMMARY OF THE INVENTION

According to the present invention there is provided a solar energy collector system comprising:
(a) a fixed array of reflectors extending in parallel rows,
(b) a common focal receiver located above the fixed array and extending parallel to the rows of reflectors and upon which incident solar radiation from all of the reflectors is reflected, the receiver including a heat absorbing medium adapted to absorb heat from the reflected radiation, (c) an elevated support structure for the fixed array of reflectors and the receiver, wherein each row of reflectors is oriented at a respective fixed angle relative to the support structure, and (d) upright elevation means to which the support structure is pivotally mounted to allow controlled rotation of the fixed array and receiver simultaneously about a pivotal axis extending parallel to the rows of reflectors so as to track the movement of the sun.

Preferably, the reflectors are either planar reflectors or curvilinear reflectors.

In a preferred form, the receiver extends symmetrically of the array.

It is preferred that the receiver comprises a pipe configured to channel a heat absorbing fluid.

Preferably, the pivotal axis is a polar axis and extends symmetrically of the array.

In another preferred form, controlled rotation of the fixed array and the receiver is provided by an electro-mechanically associated controller and drive system.

It is preferred that adjacent parallel rows of reflectors are separated by an air gap.

According to a yet further preferred form, the receiver further comprises a secondary reflector located above the pipe and configured to reflect to the pipe any reflected radiation from the reflector array which does not strike the pipe.

The receiver preferably comprises a photovoltaic or thermo-voltaic cell.

According to another preferred form of the invention, the system comprises a plurality of focal receivers.

Preferably, the upright elevation means for the support structure includes an adjustable assembly for providing declination axis tracking of the movement of the sun through the seasons of a year, whereby each row of reflectors is oriented at a common adjustable angle relative to the upright elevation means.

BRIEF DESCRIPTION OF THE DRAWINGS

In order that the invention may be readily understood and put into practical effect, reference will now be made to the accompanying drawings, in which:

FIG. 1 is a perspective view of a prior art parabolic trough collector,

FIG. 2 is a perspective view of a prior art linear Fresnel collector,

FIG. 3 is a perspective view of a rotatable reflector assembly of the prior art linear Fresnel collector of FIG. 2, FIG. 4 is a side schematic view of the prior art linear Fresnel collector of FIG. 2 and showing the general operation of similar types of solar collector.

FIG. 15 is a side schematic view showing the path of sunlight reflected from a mirror surface comprising a fixed array of curvilinear reflectors of a solar energy collector system according to another preferred embodiment of the present invention, the path reflected to a focus at which is located a focal receiver of the system.

DETAILED DESCRIPTION OF PREFERRED EMBODIMENTS

A solar energy collector system 32, according to a preferred embodiment of the present invention, is shown in FIGS. 5 to 9. The collector system 32 includes an array 34 of linear reflectors defining a mirror surface, a focal receiver 36 for heating a heat absorbing medium located at the focus of the array 34 (i.e. the focal axis) and adapted to absorb heat from sunlight reflected from the linear reflectors, and a structure 38 adapted to support the array 34 and the focal receiver 36. The receiver 36 extends symmetrically of the array 34.

Figure 12A:
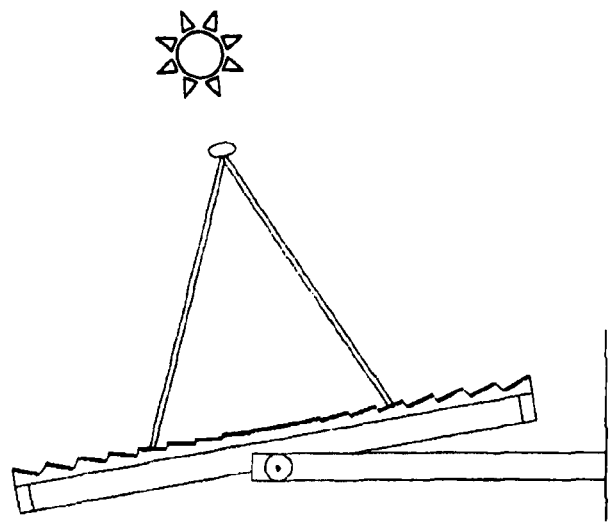
FIG. 12 is a sequence of side views of a solar energy collector system utilizing the mirror surface shown in FIGS. 10 and 11, showing the system tracking the daily motion of the sun across the sky.
Figure 12B:
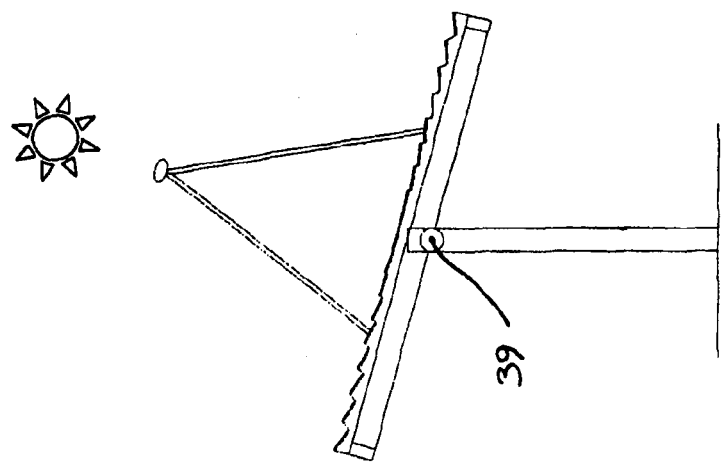
Figure 12C:
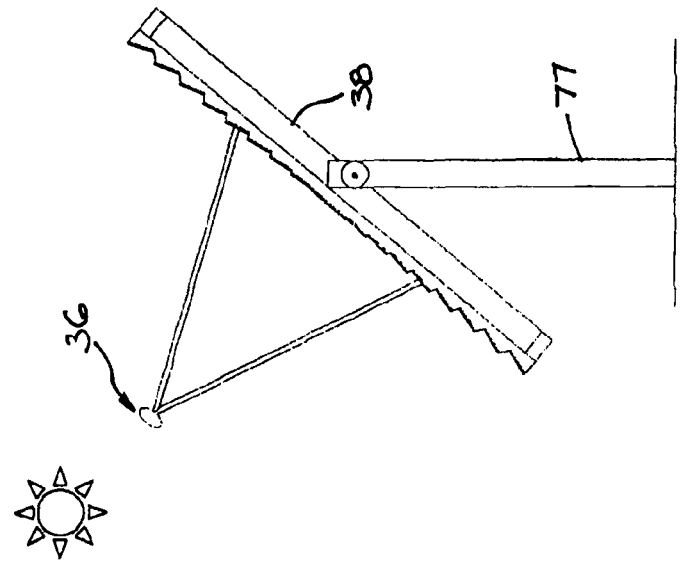

However, unlike the prior art linear Fresnel collector 16, the support structure 38 of the collector system 32 is specially contoured, elevated and is adapted to rotate about a single axis 39 such that the aperture of the mirror surface is at right angles to the plane of the mirror surface which is, in turn, constantly pointed at, or perpendicular to, the sun as shown in FIG. 12. The pivotal axis 39 is, in this embodiment, the polar axis and extends symmetrically of the array. By contrast, the support structure of the prior art Fresnel collector 16 (see FIGS. 2, 3 and 4) is flat, affixed to the ground and unable to rotate.

Figure 5:
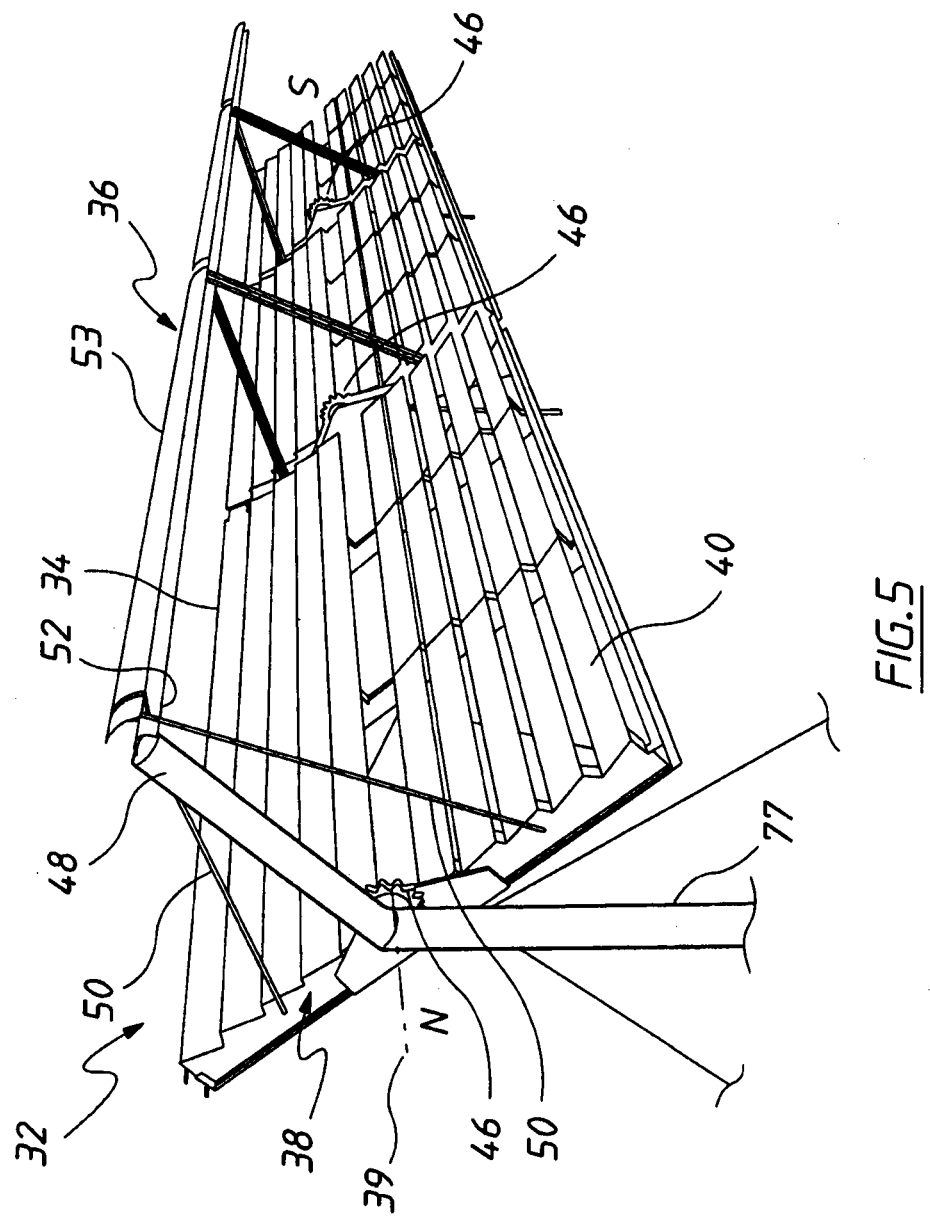
FIG. 5 is a perspective view of a solar energy collector system according to a preferred embodiment of the present invention.
Figure 6:
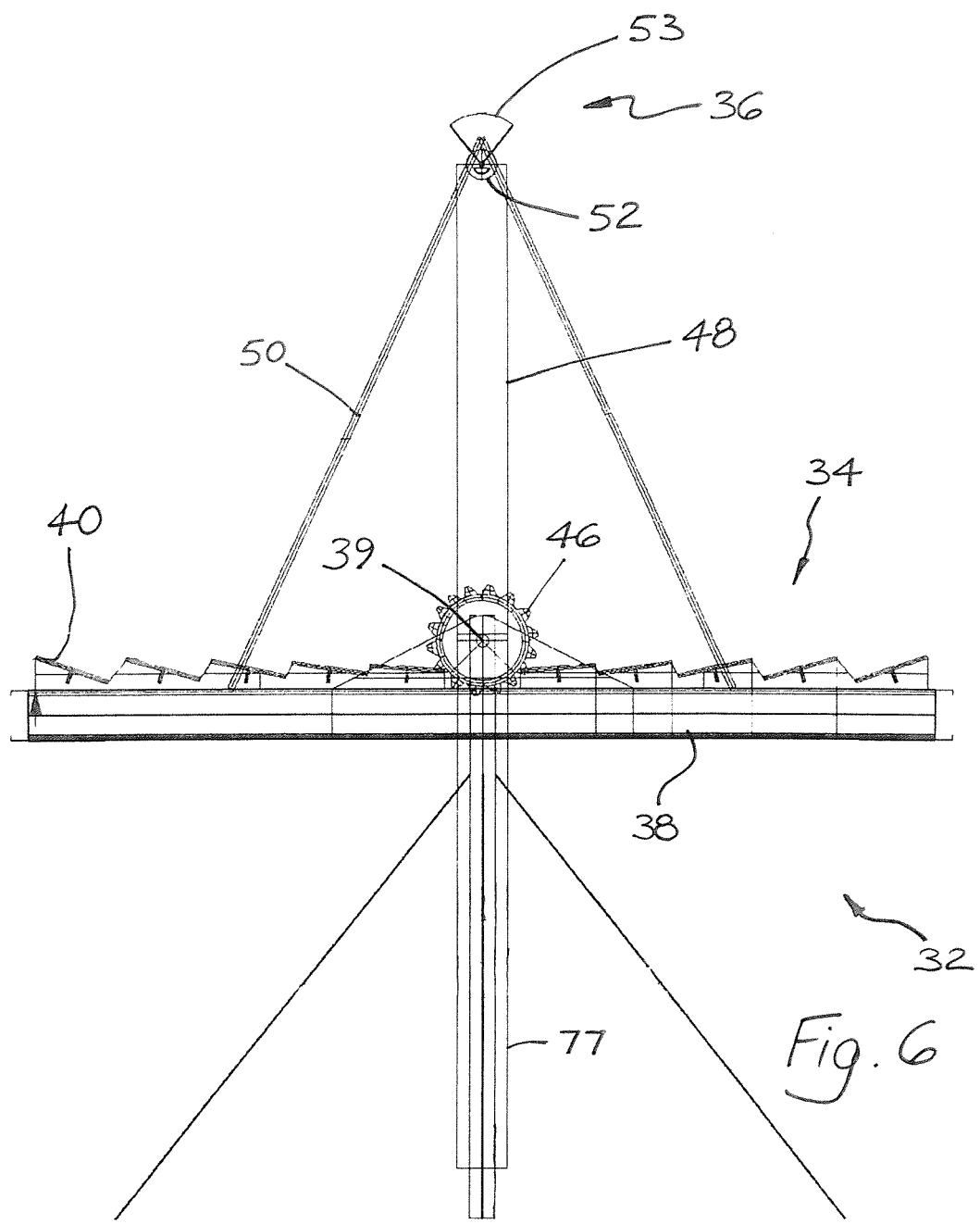
FIG. 6 is a side view of the solar energy collector system of FIG. 5 when aligned with a horizontal plane.
Figure 7:
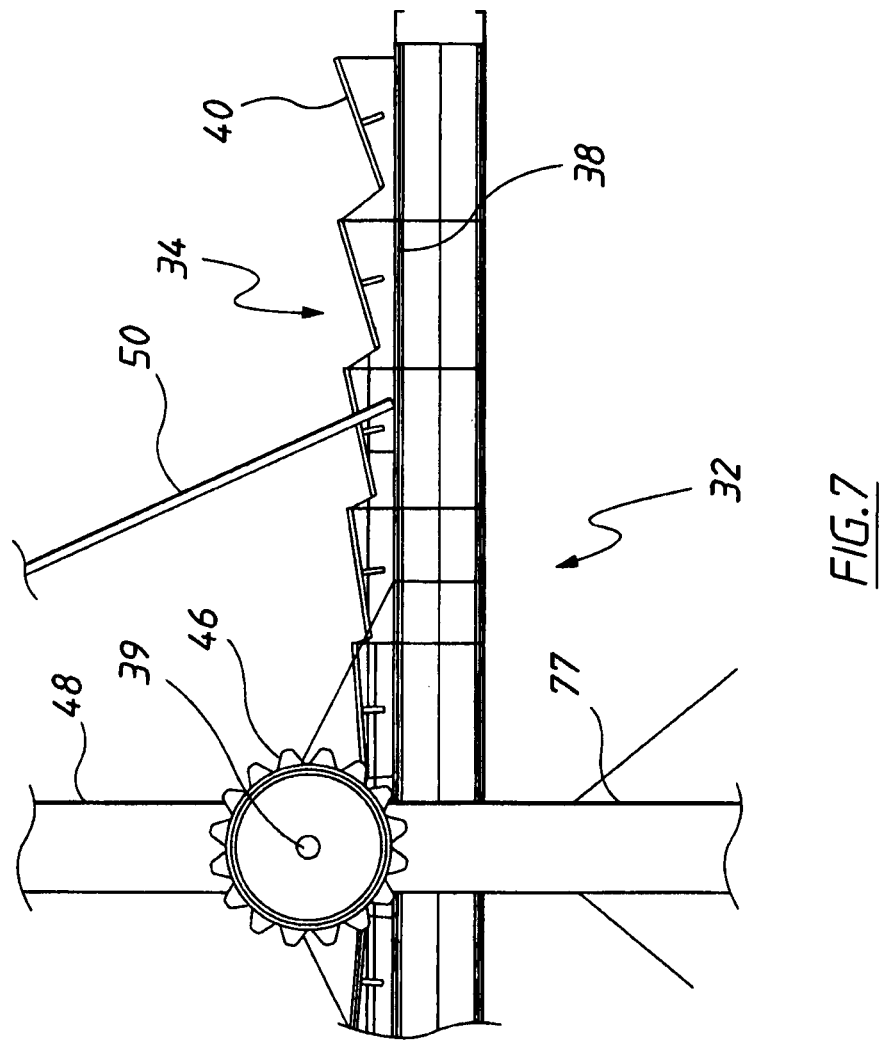
FIG. 7 is an enlarged view of a portion of the mirror surface and support structure of the solar energy collector system as shown in FIG. 6.
Figure 8:
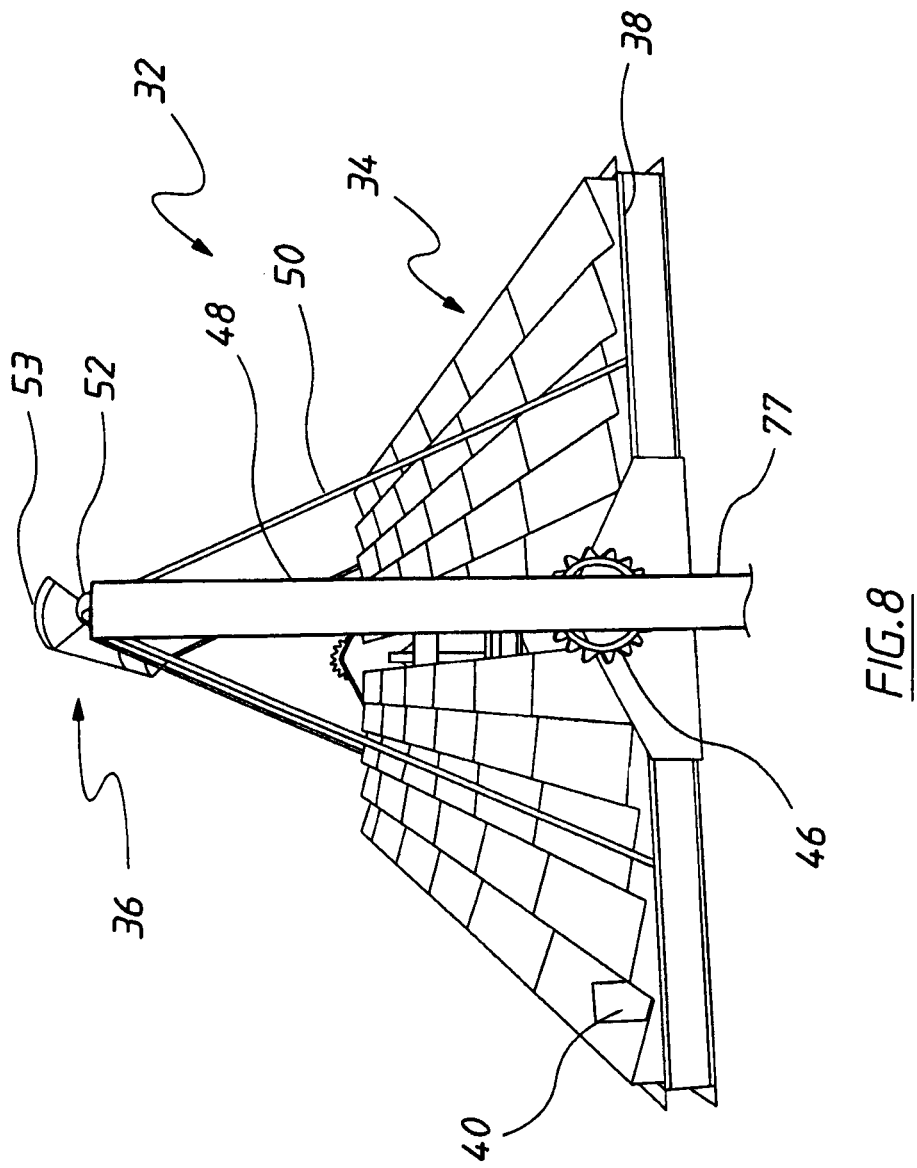
FIG. 8 is an end perspective view of the solar energy collector system of FIG. 5.
Figure 9:
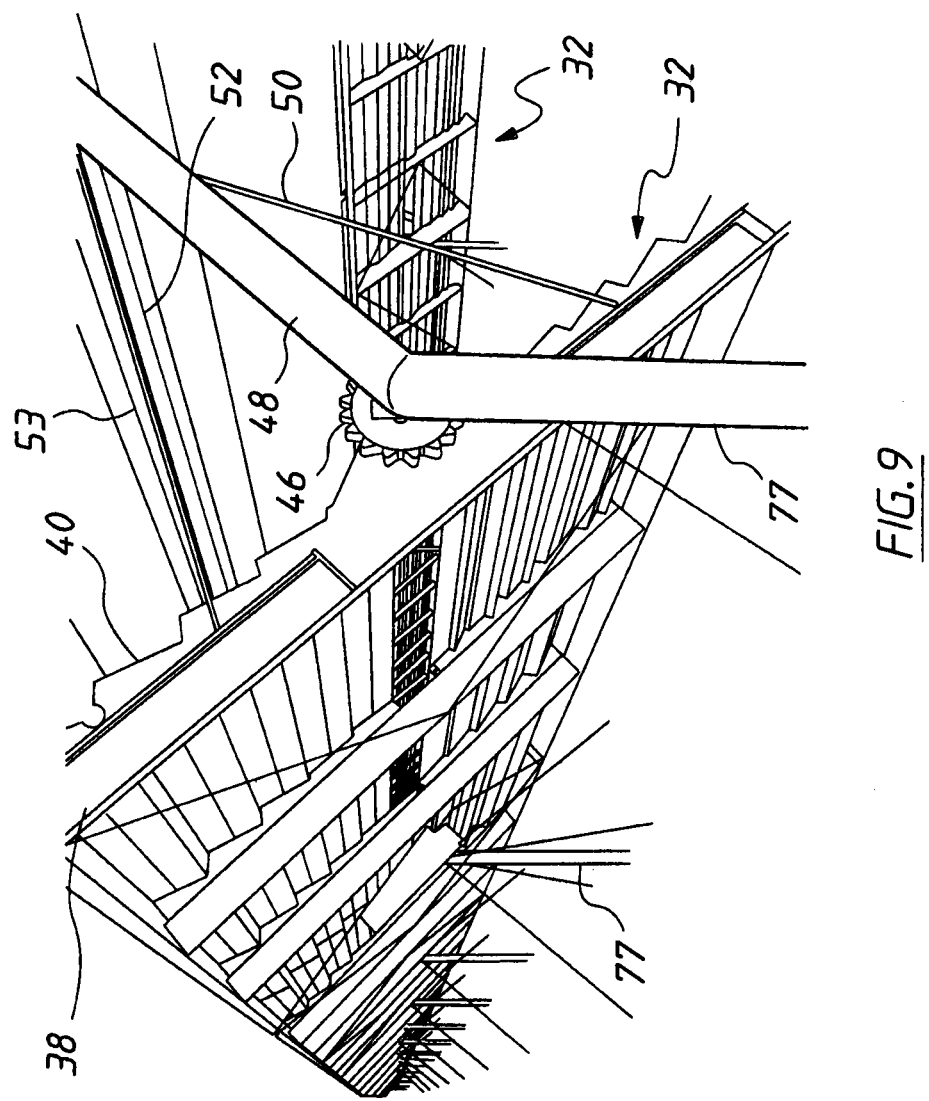
FIG. 9 is a perspective view of the underside of the solar energy collector system of FIG. 5, and also shows another such system behind it.
Figure 10:
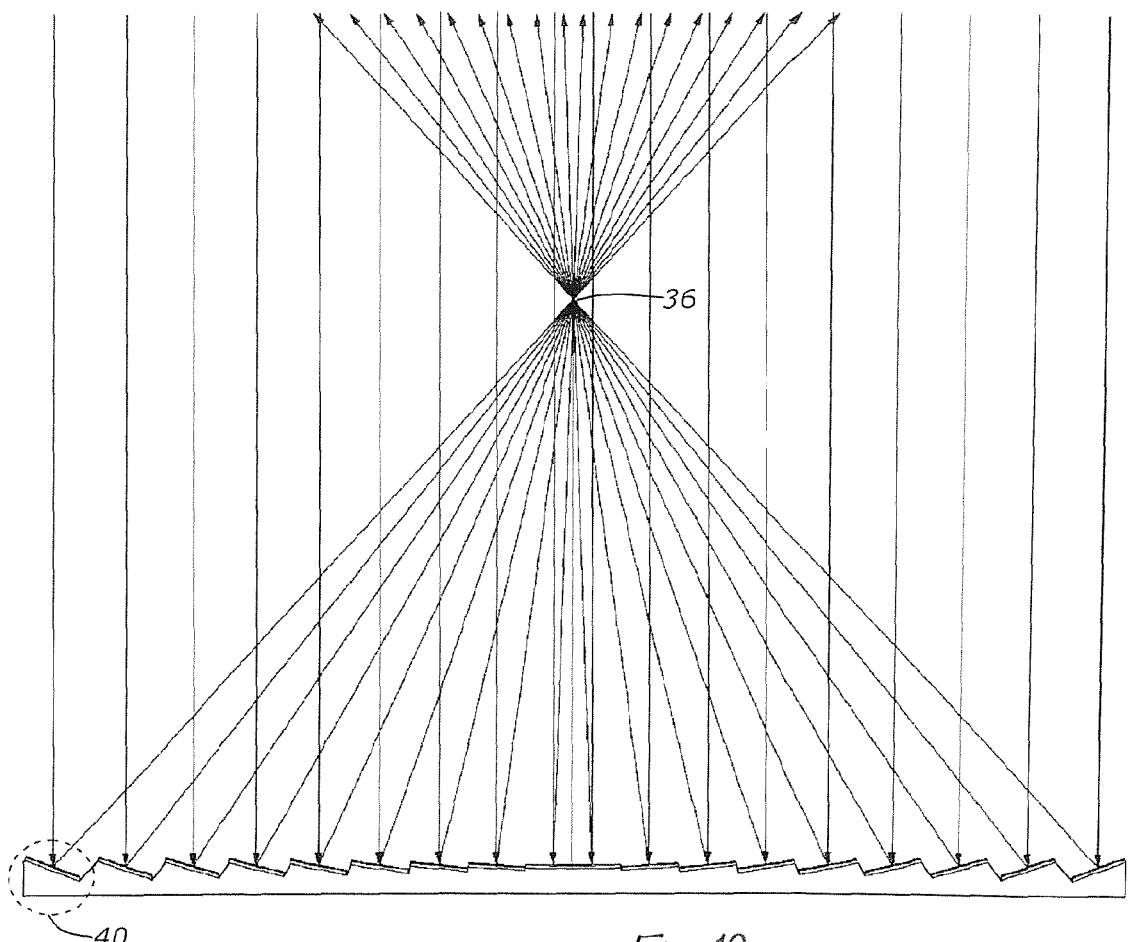
FIG. 10 is a side schematic view showing the path of sunlight reflected from a mirror surface comprising a fixed array of planar reflectors of a solar energy collector system according to another preferred embodiment of the present invention, the path reflected to a focus at which is located a focal receiver of the system.

The collector system of the present invention is further characterised in that each reflector 40 is positioned at a fixed angle adapted to focus light onto receiver 36. This is shown by reference to the embodiment of FIG. 10. The prior art Fresnel collector 16 (see FIG. 2) comprises reflectors (see FIG. 3) which must be rotated individually and independently (see FIG. 4) to track the daily motion of the sun. As a result, the collector 32 obviates the need for individual drive and control and positioning systems for each reflector 40, which considerably reduces the overall complexity, vulnerability to failure, and cost of the collector system 32.

The present invention is further characterised in that the ability to rotate the support structure 38 about a single axis 39, usually but not necessarily located at the centre of mass of the collector system, greatly simplifies the design and assembly of the rotating joint necessary to convey the thermal fluid or other heat conducting material.

Figure 11:
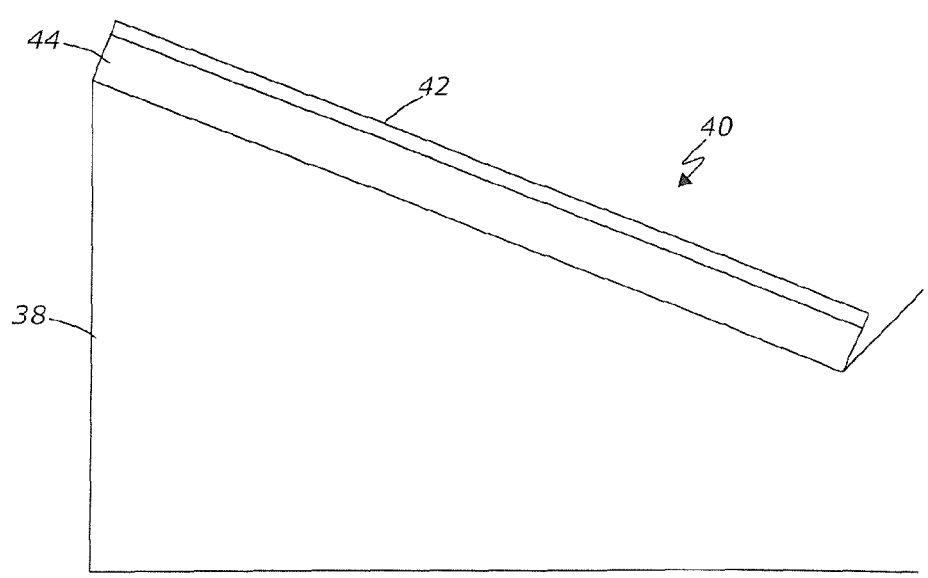
FIG. 11 is a side view of an individual reflector of the mirror surface of a solar energy collector system of FIG. 10.

An individual linear reflector 40 of the embodiments of the collector system shown in FIGS. 5 to 10 is shown in FIG. 11, and comprises a planar reflector 42 or mirror which rests on a substrate 44 which is supported on the contoured structure 38.

Referring to FIGS. 5 to 9, the support structure 38 is connected to an electro-mechanically associated controller and drive system 46 which provides controlled rotation of the fixed array and its support structure to follow the daily motion of the sun (see FIG. 12).

The focal receiver 36 includes, in this embodiment, a concave secondary reflector 53 which heats a heat absorbing medium, such as pipe 52 through which is channeled a thermal conductor fluid or other heat conducting material which may be a solid, liquid or gas. The receiver may, for example, comprise a photovoltaic or thermo-voltaic cell. The heat absorbing medium is ideally heated directly by reflected sunlight from the array of reflectors, and so the concave reflector 53 is used to reflect and further concentrate stray reflected sunlight upon the pipe 52. The focal receiver 36 is supported by a stanchion 48 and intermediate supports 50.

FIG. 15 shows a mirror surface 70 comprising a fixed array of curvilinear reflectors 72 of another embodiment of solar energy collector system of the present invention, and the path 73 of sunlight reflected from the mirror surface 70 to a focus 74 at which is located a focal receiver of the system. Each curvilinear reflector 72 is a discrete segment of a parabolic curve, all such curve segments having a common focus. The curvilinear reflectors 72 are formed in a fixed array and define a substantially planar mirror surface, the array and its focal receiver being supported by a similarly planar structure 76 that is elevated and adapted to rotate about a single axis in the same way as occurs with the fixed array 34 of linear reflectors for the collector system 32 described above. As with the collector system 32, there are air gaps between each adjacent row of reflectors 72, although this is only a preferred feature. In some embodiments, there may be no air gaps between adjacent rows of reflectors.

After use of the solar energy collector system of the present invention, the support structure may be rotated into a non-use, or "parked", position, such that the fixed array of reflectors defining the mirror surface points towards the ground, thereby protecting the mirror surface from the effect of harsh winds, rain, hail and other damage causing agents. This non-use position is readily achievable primarily because the support structure for the fixed array of reflectors is elevated by an upright elevation assembly 77, and so the support structure can be rotated about a single axis in the manner as described above.

A particularly preferred elevated support structure is rectangular in shape, as is shown in the embodiments of the invention described above, although other shapes may be used depending on circumstances. A rectangular support structure has a framework of long, interconnected frame members at the front and rear of the collector system, and shorter length side frame numbers at the opposed sides or ends of the collector system and at intervals between the opposed sides. When supported by such a relatively shallow structure, the fixed array of reflectors defines a mirror surface that is substantially planar.

Figure 16:
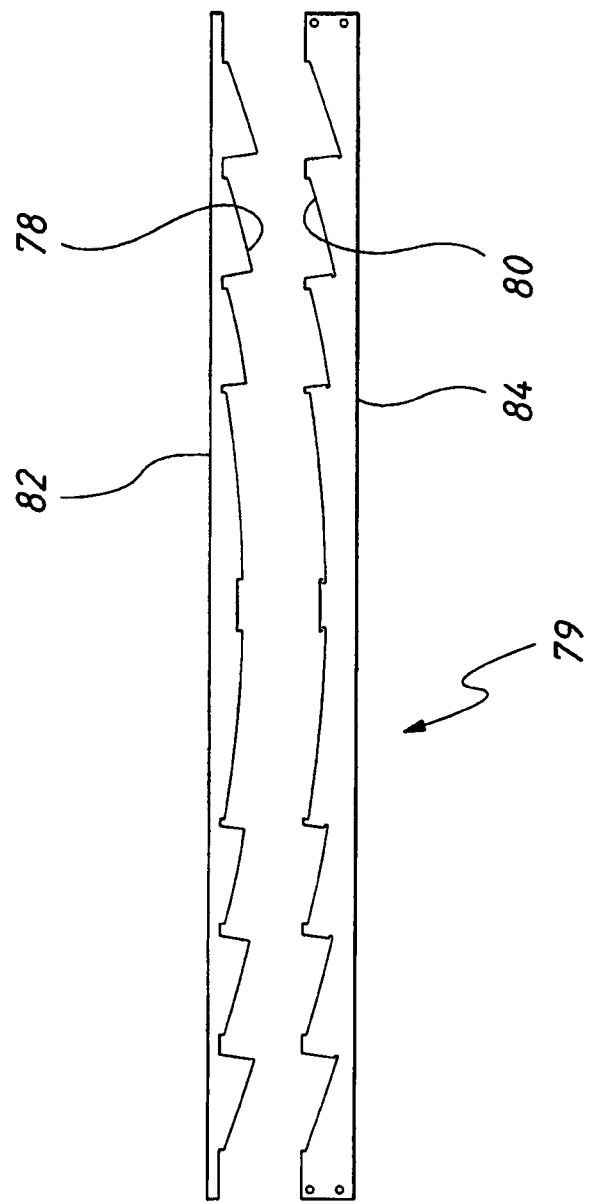
FIG. 16 is a side schematic view of upper and lower frame portions of a support structure for a fixed array of curvilinear reflectors of a solar energy collector system according to FIG. 15.

For the fixed array of curvilinear reflectors 72, the side frame members 79 may be configured as upper and lower frame portions which can clamp the reflectors 72 therebetween by being locked together. They thus define the profiles of the parabolic segment reflectors necessary to achieve a common focus. Such upper and lower frame portions 82, 84 of a side frame member are shown in FIG. 16, and have complementary facing profiles 78, 80. The frame portions 82, 84 can be manufactured by laser or water jet cutting at much lower cost and higher degree of accuracy than roll forming or curving techniques necessary to produce a curved frame or the like. In an alternative embodiment, the side frame members may comprise a lower frame portion 84 only, provided that the reflectors can be stably fixed thereto and the mirror surface created by an array of such reflectors is substantially planar. Other components of the support structure may include stays, braces, spacers and other profile forming elements.

Another form of support structure that may be used in the present invention is one utilizing an elevated central support spline, which is rotatable and has a plurality of fixed reflector support arms extending perpendicularly therefrom in opposite directions. The arms support each row of reflectors as a fixed array and at suitable angles to achieve a common focus for sunlight reflected therefrom. The mirror surface defined by such an array, and supported in the aforementioned manner, is substantially planar and therefore much shallower than parabolic trough collectors. Such central splines may be tubular, trussed or otherwise configured to rotatably support the fixed array of reflectors.

An elevated and rotatable support structure for the fixed array of reflectors which is substantially planar is simpler, more versatile, cheaper and easier to manufacture and erect than support structures for prior art solar collectors. It is also easier to rotate around an axis, such as at the centre of mass, than the larger and heavier parabolic trough collectors having the same aperture width. Shallow, substantially planar, support structures of this kind also allow parabolic reflection to occur over a wider area than that which can occur with parabolic trough collectors, because a large number of rows of parabolic segment reflectors having a common focus can be spread over a wide area defined within a shallow, substantially planar support structure. The wider the area of mirror surface, the greater is the sunlight concentration ratio.

Declination axis tracking of the movement of the sun through the seasons of a year is also a feature of the solar energy collector system of the present invention. To achieve this, the upright support posts and other components of the elevation assembly for the support structure are suitably adjustable, whereby each row of reflectors is oriented at a common angle relative to the upright support posts.

The present invention combines some of the advantages of linear Fresnel collectors and parabolic trough collectors. The present invention uses a fixed array of reflectors extending in parallel rows to define a mirror surface. This embodiment simplifies manufacturing and reduces the requirements for the supporting structure and framing. Using an array of reflectors also allows the use of low cost mirror glass and standard building industry materials to minimise the cost of construction materials and equipment. The fixed array of reflectors is supported by a shallow, substantially planar, structure which rotates about a single axis to avoid shading by adjacent reflectors at low sun angles. Each reflector is positioned at a fixed angle adapted to focus sunlight onto a receiver to simplify the drive and control and positioning system. The aperture of the mirror surface of the system of the present invention is optimally positioned such that the system is always pointed directly at the sun to optimize reflector efficiency, especially at low sun angles.

The present invention also has advantages over the known prior art because of its compact shape and shallow form factor and, as a result, the collector system has a low applied load and bending moment. The collector system may also have a very low wind load due to its ventilated design, i.e. preferred gaps between rows of reflectors.

The shallow form factor of the planar reflector frame also reduces wind loading and overturning moment typically associated with conventional parabolic trough reflector frames. The air gaps allow wind and air flow through the structure, thereby significantly reducing the associated wind loading. The substantially planar support structure allows for a significant reduction in the depth of the collector system.

Figure 14:
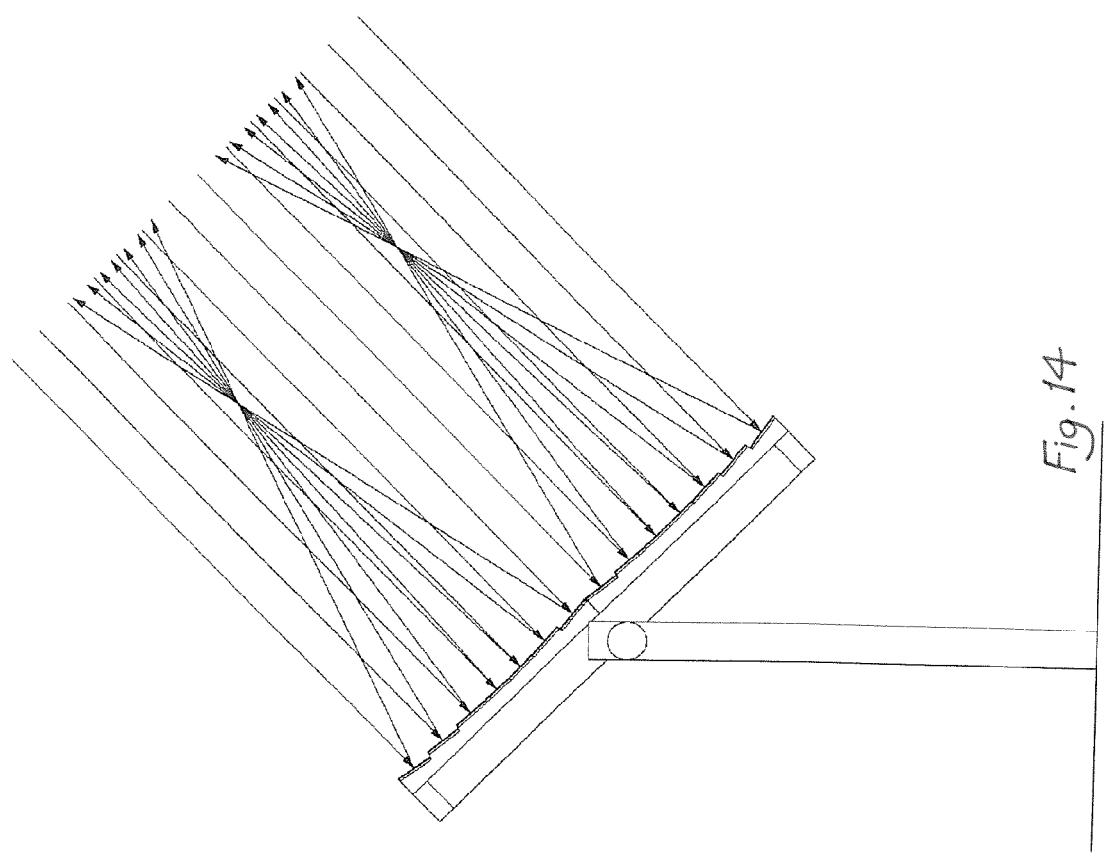
FIG. 14 is a side schematic view showing the path of sunlight reflected from the mirror surface to the focal receivers of the solar energy collector system of FIG. 13.
Figure 13:
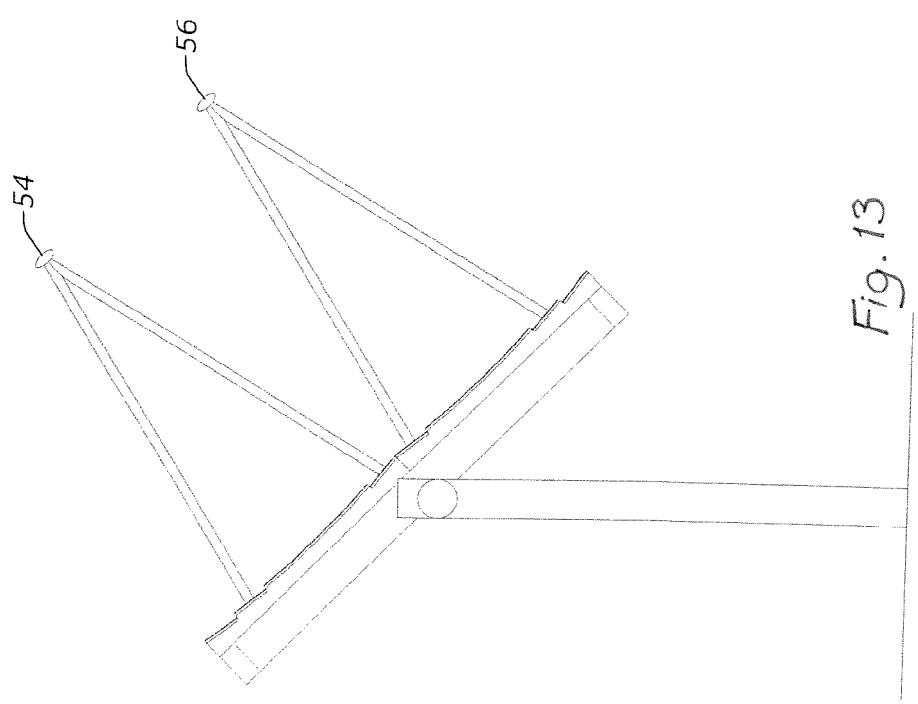
FIG. 13 is a side view of a solar energy collector system according to another preferred embodiment of the present invention, which has two focal receivers.

It will be apparent to persons skilled in the art that various modifications may be made in details of design and construction of the solar energy collector system described above, including the addition of multiple focal receivers (see receivers 54 and 56 in FIGS. 13 and 14, for example), without departing from the scope or ambit of the present invention.

It will also be apparent to persons skilled in the art that the scope of the invention is not limited only to the production of solar power and electricity, but may be adapted so as to produce solar process heat and steam for industrial and manufacturing processes and may be further adapted so as to include thermal storage and other means to improve overall system efficiency.

The invention claimed is:

1. A solar energy collector system comprising:
   (a) a fixed array of reflectors extending in parallel rows,
   (b) a common focal receiver located above the fixed array and extending parallel to the rows of reflectors and upon which incident solar radiation from all of the reflectors is reflected, the receiver including a heat absorbing medium adapted to absorb heat from the reflected radiation,
   (c) an elevated support structure having a substantially planar surface upon which the fixed array of reflectors is mounted, and the receiver mounted on the elevated support structure, wherein each row of reflectors is
      (i) oriented at a respective fixed angle relative to the substantially planar surface of the support structure to achieve a substantially parabolic reflection, or
      (ii) shaped to achieve a substantially parabolic reflection, and
   (d) an upright elevation assembly to which the support structure is pivotally mounted to allow controlled rotation of the fixed array and receiver simultaneously about a pivotal axis extending parallel to the rows of reflectors so as to track the movement of the sun.

2. The solar energy collector system of claim 1 wherein the reflectors are either planar reflectors or curvilinear reflectors.

3. The solar energy collector system of claim 1 wherein the receiver extends symmetrically of the array.

4. The solar energy collector system of claim 1 wherein the receiver comprises a pipe configured to channel a heat absorbing fluid.

5. The solar energy collector system of claim 4 wherein the receiver further comprises a secondary reflector located above the pipe and configured to reflect to the pipe any reflected radiation from the reflector array which does not strike the pipe.

6. The solar energy collector system of claim 1 wherein the pivotal axis is a polar axis and extends symmetrically of the array.

7. The solar energy collector system of claim 1 wherein controlled rotation of the fixed array and the receiver is provided by an electro-mechanically associated controller and drive system.

8. The solar energy collector system of claim 1 wherein adjacent parallel rows of reflectors are separated by an air gap.

9. The solar energy collector system of claim 1 wherein the receiver comprises a photovoltaic or thermo-voltaic cell.

10. The solar energy collector system of claim 1 wherein the system comprises a plurality of focal receivers.

11. The solar energy collector system of claim 1 wherein the upright elevation assembly includes an adjustable assembly for providing declination axis tracking of the movement of the sun through the seasons of a year, whereby each row of reflectors is oriented at a common adjustable angle relative to the upright elevation assembly.

* * * * *